(12) United States Patent
Tomohiro

(10) Patent No.: US 9,570,405 B2
(45) Date of Patent: Feb. 14, 2017

(54) SEMICONDUCTOR DEVICE AND METHOD FOR MANUFACTURING SAME

(71) Applicants: PS4 LUXCO S.A.R.L., Luxembourg (LU); Atsushi Tomohiro, Tokyo (JP)

(72) Inventor: Atsushi Tomohiro, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/768,818

(22) PCT Filed: Feb. 12, 2014

(86) PCT No.: PCT/JP2014/053157
§ 371 (c)(1),
(2) Date: Aug. 19, 2015

(87) PCT Pub. No.: WO2014/129351
PCT Pub. Date: Aug. 28, 2014

(65) Prior Publication Data
US 2016/0005696 A1 Jan. 7, 2016

(30) Foreign Application Priority Data

Feb. 21, 2013 (JP) ................................ 2013-032151

(51) Int. Cl.
*H01L 23/48* (2006.01)
*H01L 23/52* (2006.01)
(Continued)

(52) U.S. Cl.
CPC .............. *H01L 23/552* (2013.01); *H01L 21/56* (2013.01); *H01L 21/561* (2013.01); *H01L 23/16* (2013.01);
(Continued)

(58) Field of Classification Search
CPC ...... H01L 23/48; H01L 25/043; H01L 23/538; H01L 23/544; H01L 23/552
(Continued)

(56) References Cited

U.S. PATENT DOCUMENTS 7,566,955 B2 * 7/2009 Warner .................. G06F 21/10
257/678
2005/0224943 A1 * 10/2005 Sahaida .................. G11C 5/06
257/686
(Continued)

FOREIGN PATENT DOCUMENTS

JP 08017951 1/1996
JP 08017952 1/1996
JP 09180973 7/1997

OTHER PUBLICATIONS

Application No. PCT/JP2014/053157, International Search Report, May 20, 2014.

*Primary Examiner* — Theresa T Doan
(74) *Attorney, Agent, or Firm* — Kunzler Law Group, PC

(57) ABSTRACT

One semiconductor device includes a wiring substrate, a semiconductor chip layered on one face of the wiring substrate and having a first face facing the wiring substrate and a second face positioned on a reverse side from the first face, a circuit being formed on at least the second face, a non-circuit-incorporating chip in which a circuit is not formed, the non-circuit-incorporating chip being layered on the second face of the semiconductor chip, and a sealing resin disposed between at least the wiring substrate and the non-circuit-incorporating chip.

17 Claims, 8 Drawing Sheets

(51) Int. Cl.

| | | |
|---|---|---|
| *H01L 23/552* | (2006.01) | |
| *H01L 23/00* | (2006.01) | |
| *H01L 23/16* | (2006.01) | |
| *H01L 23/31* | (2006.01) | |
| *H01L 21/56* | (2006.01) | |
| *H01L 23/544* | (2006.01) | |
| *H01L 25/065* | (2006.01) | |
| *H01L 25/18* | (2006.01) | |
| H01L 23/498 | (2006.01) | |
| H01L 25/00 | (2006.01) | |

(52) U.S. Cl.
CPC ....... *H01L 23/3107* (2013.01); *H01L 23/3128* (2013.01); *H01L 23/544* (2013.01); *H01L 24/97* (2013.01); *H01L 25/0657* (2013.01); *H01L 25/18* (2013.01); *H01L 23/49816* (2013.01); *H01L 23/49827* (2013.01); *H01L 24/16* (2013.01); *H01L 24/32* (2013.01); *H01L 24/48* (2013.01); *H01L 24/73* (2013.01); *H01L 25/50* (2013.01); *H01L 2223/5442* (2013.01); *H01L 2223/54406* (2013.01); *H01L 2223/54433* (2013.01); *H01L 2223/54486* (2013.01); *H01L 2224/0401* (2013.01); *H01L 2224/04042* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73215* (2013.01); *H01L 2224/73253* (2013.01); *H01L 2224/73265* (2013.01); *H01L 2224/92247* (2013.01); *H01L 2224/97* (2013.01); *H01L 2225/0651* (2013.01); *H01L 2225/06517* (2013.01); *H01L 2225/06558* (2013.01); *H01L 2225/06568* (2013.01); *H01L 2924/15311* (2013.01); *H01L 2924/181* (2013.01); *H01L 2924/1815* (2013.01)

(58) Field of Classification Search
USPC .......................................................... 257/777
See application file for complete search history.

(56) References Cited

U.S. PATENT DOCUMENTS

| | | | |
|---|---|---|---|
| 2007/0082298 A1* | 4/2007 | Sakamoto | ........... G03F 7/70425 |
| | | | 430/313 |
| 2008/0237830 A1 | 10/2008 | Ino et al. | |
| 2009/0230539 A1 | 9/2009 | Kamimura | |
| 2010/0084758 A1 | 4/2010 | Mun | |

* cited by examiner

SEMICONDUCTOR DEVICE AND METHOD FOR MANUFACTURING SAME

TECHNICAL FIELD

The present invention relates to a semiconductor device and a method for manufacturing the same.

BACKGROUND

Patent literature article 1 discloses a method of manufacturing a plurality of semiconductor devices from one substrate (wiring mother substrate). According to this method, a plurality of semiconductor devices can be obtained by arranging and securing a plurality of semiconductor chips in a matrix formation in a planar manner on one surface of one substrate, collectively sealing, by means of a sealing resin, the plurality of semiconductor chips secured to the substrate, and then cutting the substrate and the sealing resin in accordance with the semiconductor chips.

In the method described in patent literature article 2, a plurality of semiconductor chips are secured to one surface of one substrate (a multi-piece substrate) and are sealed collectively by means of a sealing resin, in the same way as in patent literature article 1, after which a characteristic inspection is performed for each semiconductor chip, the inspection results, for example, are marked on the sealing resin, and the substrate and the sealing resin are then cut. In the step of marking the sealing resin, generally letters or the like are formed by removing parts of the surface of the sealing resin by heating said surface using laser radiation, in order to display the semiconductor chip inspection results, a company name or a product name, for example.

PATENT LITERATURE

Patent literature article 1: Japanese Patent Kokai 2012-104790

Patent literature article 2: Japanese Patent Kokai 2003-078072

SUMMARY OF THE INVENTION

Problems to be Resolved by the Invention

According to the method of manufacturing the semiconductor device disclosed in patent literature article 2, it is possible to display the semiconductor chip inspection results, company name, product name or the like on the semiconductor device itself. However, in the marking step there is a possibility that the energy from the laser (for example a YAG (Yttrium Aluminum Garnet) laser) radiated onto the sealing resin which covers circuits located on the surface of the semiconductor chip will pass through the sealing resin and be transmitted to the circuits on the semiconductor chip, causing the circuits on the semiconductor chip to break. In order for semiconductor devices installed in portable electronic equipment, in particular, to be made thinner and more compact, it is desirable for the thickness of the sealing resin covering the semiconductor chip to be reduced, and consequently the problem of circuits breaking as a result of laser radiation in the marking step is more liable to occur. Further, if energy from a laser or the like is imparted to sealing resin for other applications also, not limited to the marking application presented in patent literature article 2, there is a risk that the energy will pass through the sealing resin and damage circuits on the semiconductor chip.

Means of Overcoming the Problems

The semiconductor device of the present invention comprises: a wiring substrate; a semiconductor chip which is stacked on one surface of the wiring substrate, has a first surface facing the wiring substrate and a second surface located on the opposite side to the first surface, and on at least the second surface of which a circuit is formed; a chip without a built-in circuit, on which a circuit is not formed and which is stacked on the second surface of the semiconductor chip; and a sealing resin disposed at least between the wiring substrate and the chip without a built-in circuit.

According to this configuration, even if, for example, energy is imparted when a laser is radiated, for example, to form a marking or the like on the semiconductor device, the energy is reflected or blocked by the chip without a built-in circuit, and little of the energy reaches the semiconductor chip. Damage to circuits formed on the semiconductor chip can therefore be suppressed. Because no circuits are formed on the chip without a built-in circuit, no problems arise even if it is subjected to the energy of a laser.

Advantages of the Invention

According to the present invention it is possible to suppress the occurrence of damage to circuits, formed on the semiconductor chip, when a laser is radiated to form a marking, for example. Therefore a marking having any size or shape can be formed in any location, including a location that overlaps the semiconductor chip as seen in a plan view. Further, it is possible to radiate a high-frequency laser without taking into account damage to the circuits, and it is therefore possible to improve the accuracy and detail with which the marking is formed.

BRIEF EXPLANATION OF THE DRAWINGS

FIG. 4b is a cross-sectional view illustrating the step following FIG. 4a.

FIG. 5b is a cross-sectional view illustrating the step following FIG. 5a.

FIG. 8b is a cross-sectional view illustrating the step following FIG. 8a.

FIG. 9b is a cross-sectional view illustrating the step following FIG. 9a.

MODES OF EMBODYING THE INVENTION

Modes of embodying the present invention will now be described with reference to the drawings.

First Mode of Embodiment

Figure 1:
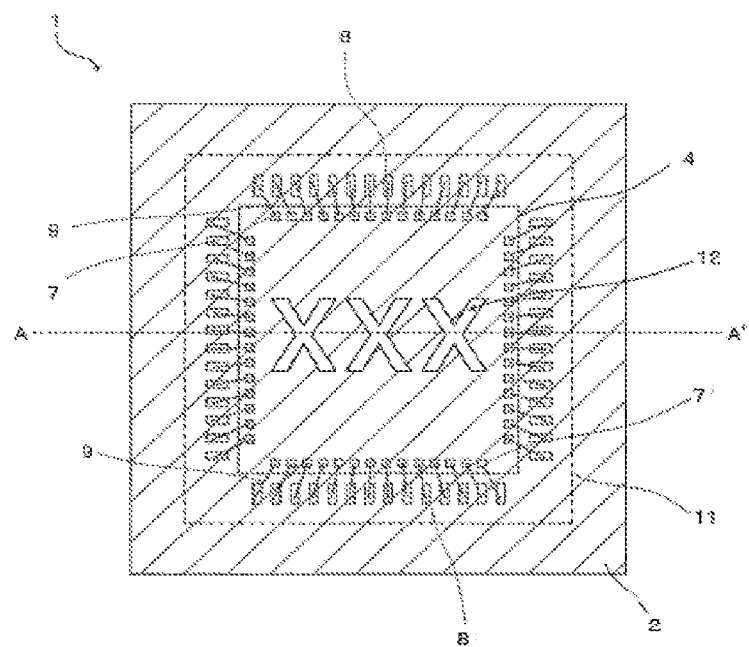
FIG. 1 is a plan view illustrating a semiconductor device in a first mode of embodiment of the present invention.
Figure 2:
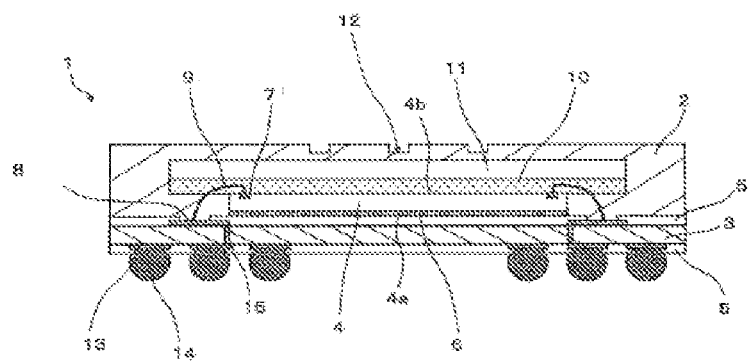
FIG. 2 is a cross-sectional view through the line A-A in FIG. 1.
Figure 3:
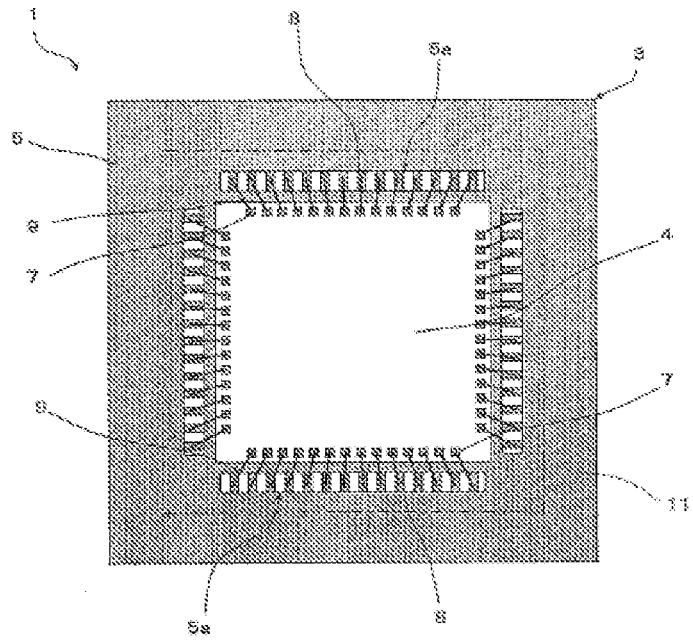
FIG. 3 is a plan view in which the sealing resin in the semiconductor device illustrated in FIG. 1 has been omitted.

FIG. 1 is a plan view illustrating a semiconductor device 1 in one mode of embodiment of the present invention, FIG. 2 is a cross-sectional view through the line A-A, and FIG. 3 is a plan view in which sealing resin 2 has been omitted. It should be noted that in this specification, 'up' and 'down' take as a reference a wiring substrate 3 of the semiconductor device 1 in its completed state as illustrated in FIGS. 1 and 2, where 'up' is defined as the surface side of the wiring substrate 3 on which a semiconductor chip 4 is installed, and 'down' is defined as the surface side of the wiring substrate 3 on the opposite side to the surface on which the semiconductor chip 4 is installed. These definitions of 'up' and 'down', which take as a reference the surface on which the semiconductor chip is installed, in the wiring substrate 3 of the semiconductor device 1 in its completed state, and the surface on the opposite side thereto, are also applied, for example, to the semiconductor chip 4 and a mirror chip (chip without a built-in circuit) 11, and are used consistently throughout this specification, without relation to the attitude of the semiconductor device 1 during use, or the temporary vertical inversion during some steps in the manufacture of the semiconductor device 1.

In the semiconductor device 1 in this mode of embodiment, the semiconductor chip 4, which comprises silicon or the like and in which circuits such as logic circuits or memory circuits (which are not shown in the drawings) are formed, is stacked on one surface of the wiring substrate 3 comprising an insulating material such as glass epoxy. More specifically, the semiconductor chip 4 is secured using an adhesive member 6 onto an insulating film 5 comprising a solder resist or the like, provided on the upper surface (the one surface) of the wiring substrate 3. The adhesive member 6 is an insulating paste or a DAF (Die Attach Film), for example.

The semiconductor chip 4 has an essentially rectangular planar shape, and has a first surface 4a facing the wiring substrate 3, and a second surface 4b located on the opposite side thereto. A plurality of electrode pads 7 are provided on the second surface (upper surface) 4b in such a way as to be aligned substantially along each edge of the essentially rectangular planar-shaped outer periphery. Then, a plurality of connection pads 8 corresponding respectively to the electrode pads 7 on the semiconductor chip 4 are provided on the upper surface of the wiring substrate 3 (the surface on which the semiconductor chip 4 is installed), to the outside of the location in which the semiconductor chip 4 is installed. The electrode pads 7 are connected to the corresponding connection pads 8 by means of bonding wires (conducting wires) 9 comprising Au, Cu or the like.

The mirror chip 11 is secured to the second surface 4b of the semiconductor chip 4 by means of an adhesive member 10. The mirror chip 11 is a chip without a built-in circuit, on which a circuit is not formed, comprising silicon or the like, and it has a surface which reflects light. The mirror chip 11 has an essentially rectangular planar shape which is larger than that of the semiconductor chip 4, and the mirror chip 11 covers the entire semiconductor chip as seen in a plan view. Portions of the bonding wires 9 (at least the part located between the semiconductor chip 4 and the mirror chip 11) are embedded in the adhesive member 10. The adhesive member 10 comprises an FOW (Film On Wire), for example, and is cured in a state in which it encloses portions of the bonding wires 9.

A sealing resin 2 is provided in such a way as to seal the semiconductor chip 4, the mirror chip 11, the bonding wires 9 and the adhesive members 6 and 10, for example, disposed on the one surface of the wiring substrate 3. The sealing resin 2 is cured in a state in which it encloses the members (the semiconductor chip 4, the mirror chip 11, the bonding wires 9, and the adhesive members 6 and 10, for example) disposed on the wiring substrate 3. A marking 12 depicting the semiconductor chip 4 inspection results, a company name or a product name, for example, is formed on the upper surface (the surface facing the opposite side to the wiring substrate 3) of the sealing resin 2. The marking 12 is formed by removing approximately 5 to 30 μm of the surface of the sealing resin 2 using laser radiation or the like. To elaborate, recessed portions generated by removing 5 to 30 μm of the surface of the sealing resin 2 give rise to diffused reflection of light, and therefore a contrast arises between the recessed portions and the flat surface of the sealing resin 2, making it possible for letters, images, shapes or the like to be recognized visually.

A plurality of lands 13 are provided on the lower surface of the wiring substrate 3 (the surface on the opposite side to the surface on which the semiconductor chip 4 is installed), and a solder ball 14 is secured to each land 13 to form a BGA (Ball Grid Array) structure. The periphery of the lands 13 and the solder balls 14 is covered by an insulating film 5 comprising a solder resist or the like. The connection pads 8 on the upper surface of the wiring substrate 3 and the lands 13 on the lower surface of the wiring substrate 3 are connected to one another by way of vias 15 which penetrate through the wiring substrate 3. Wiring lines formed on both surfaces of the wiring substrate 3 are covered by the insulating film 5, except for the connection pads 8 on the upper surface, which are exposed by way of opening portions 5a (see FIG. 3), and the lands 13 on the lower surface.

In the semiconductor device 1 in this mode of embodiment, the mirror chip 11 is interposed between the semiconductor chip 4 and the sealing resin 2 on which the marking 12 is formed, and it is therefore possible to suppress the occurrence of damage, such as breaks of the circuits on the semiconductor chip 4, when the marking 12 is formed. To elaborate, even if the energy of a laser (for example a YAG laser) passes through the sealing resin 2 when the marking 12 is being formed by laser radiation, for example, the energy is reflected or blocked by the mirror chip 11, and does not reach the semiconductor chip 4. Damage such as breaks of the circuits formed on the semiconductor chip 4 can therefore be suppressed. Because the risk of damage to the circuits on the semiconductor chip 4 is low, the sealing resin 2 can be made thin, and by extension the semiconductor chip 1 can be made thinner.

Further, portions of the bonding wires 9 connecting the electrode pads 7 on the semiconductor chip 4 to the connection pads 8 on the wiring substrate 3 are embedded in the adhesive member 10 used to secure the mirror chip 11, and therefore the bonding wires 9 are protected by the adhesive member 10 in such a way that they do not become cut.

According to this configuration, damage to the circuits on the semiconductor chip 4 and the bonding wires 9 is suppressed, and therefore the marking 12 can be formed relatively freely, with any size and shape, and in any location on the semiconductor chip 2. As a result, an improvement in the visual properties of the marking 12 can be achieved.

A method of manufacturing the semiconductor device in this mode of embodiment will now be described.

Figure 4A:
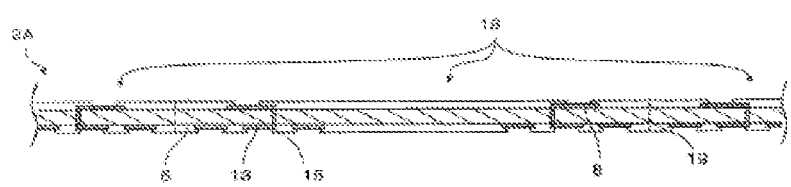
FIG. 4a is a cross-sectional view illustrating one step in a method of manufacturing the semiconductor device illustrated in FIG. 1.

A mother substrate 3A, illustrated in FIG. 4a, is first prepared. Wiring lines including the connection pads 8 are formed on one surface of the mother substrate 3A, wiring lines including the lands 13 are formed on the other surface, and some of the wiring lines on both surfaces are connected to one another by way of the vias 15. The mother substrate 3A has a configuration in which a plurality of product-forming regions 18 are disposed in a planar manner, side by side in a matrix formation, and the wiring substrate 3 illustrated in FIGS. 1 to 3 is formed by cutting the mother substrate 3A along dicing lines 19 established between pairs of product-forming regions 18. The lands 13 are disposed in a lattice formation in each product-forming region 18.

A step is carried out to arrange the adhesive member 6, used to mount the semiconductor chip 4, on the mother substrate 3A. For example, although not depicted in the drawings, a printing mask having a plurality of opening holes corresponding to each of the product-forming regions 18 is set on one surface of the mother substrate 3A, and the adhesive member 6 (for example an insulating paste or a DAF) is applied onto the printing mask. The adhesive member 6 is made to flow into the opening holes by means of a squeegee or the like, which is not shown in the drawings, after which the printing mask is removed to form a layer of the adhesive member 6, having a prescribed thickness, on each product-forming region 18. At this time, the peripheral edge portions of the adhesive members 6 are disposed in locations corresponding to gaps between the lands 13.

Figure 4B:
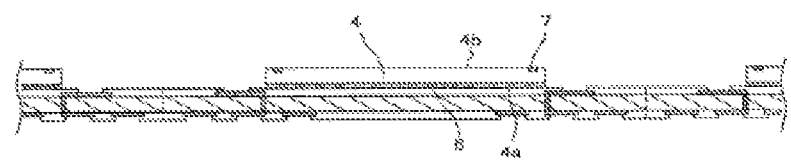

A step of die-bonding the semiconductor chips 4 is then carried out. More specifically, the semiconductor chips 4 are installed, with the interposition of the adhesive members 6, on each product-forming region 18 of the mother substrate 3A, as illustrated in FIG. 4b. The semiconductor chips 4 comprise silicon, and they have circuits such as logic circuits or memory circuits, and a plurality of electrode pads 7 which form part of said circuits. A passivation film (which is not shown in the drawings) is formed over substantially the entire second surface 4b of the semiconductor chip 4, excluding the electrode pads 7. In this mode of embodiment, the first surface (lower surface) 4a of the semiconductor chip 4, on the opposite side to the second surface (upper surface) 4b, is adhesively secured to the mother substrate 3A with the interposition of the adhesive member 6.

Figure 4C:
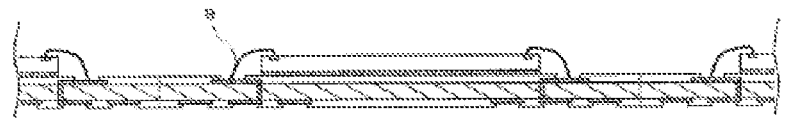
FIG. 4c is a cross-sectional view illustrating the step following FIG. 4b.

When the semiconductor chips 4 have been installed on all the product-forming regions 18 of the mother substrate 3A, a wire bonding step is carried out to connect the electrode pads 7 on the second surface 4b of the semiconductor chips 4 to the corresponding connection pads 8 on the upper surface of the mother substrate 3A by means of the electrically conductive bonding wires (conducting wires) 9 comprising Au, Cu or the like, as illustrated in FIG. 4c. More specifically, one end of the bonding wire 9, which has been melted to form a ball, is ultrasonic thermo-compression bonded to the electrode pad 7 on the semiconductor chip 4 using a wire bonding device, which is not shown in the drawings, after which the other end of the bonding wire 9 is ultrasonic thermo-compression bonded to the corresponding connection pad 8 on the mother substrate 3A. The wire bonding step of connecting the electrode pads 7 respectively to the corresponding connection pads 8 is performed in this way. It should be noted that the bonding wires 9 are held in such a way as to describe a loop shape, in order to avoid interference with the corner portions at the edges of the semiconductor chips 4.

Figure 4D:
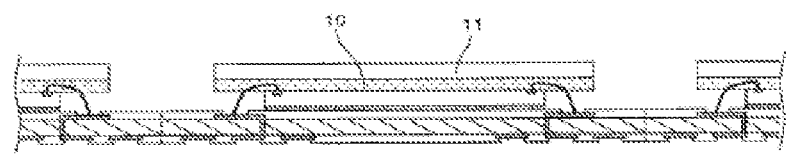
FIG. 4d is a cross-sectional view illustrating the step following FIG. 4c.

A step is then carried out to arrange the mirror chip 11 and the adhesive member 10. First, although not shown in the drawings, an FOW (Film On Wire) adhesive member is affixed to one surface of a wafer which comprises silicon or the like, on which no circuits are formed, and which has a surface which reflects light. The wafer is then cut, to yield a mirror chip 11 (see FIG. 4d), which is a chip without a built-in circuit, to one surface of which the FOW adhesive member 10 is attached. The planar shape of the mirror chip 11 is larger than the planar shape of the semiconductor chip 4. The mirror chips 11 to which the adhesive member 10 has been attached are disposed on the second surfaces 4b of each of the semiconductor chips 4 installed on the mother substrate 3A. By making the surface of the mirror chip 11 to which the adhesive member 10 is attached face toward the semiconductor chip 4, the condition of the mirror chip 11 is such that it is disposed on the mother substrate 3A with the interposition of the adhesive member 10. More specifically, the mother substrate 3A which has completed the wire bonding step is installed and held on a bonding stage of a die bonding device, which is not shown in the drawings, and the mother substrate 3A, installed on the bonding stage, and the semiconductor chips 4 and the bonding wires 9 mounted on said mother substrate 3A are heated to a bonding temperature (for example 150° C.) by means of a heater with which the bonding stage is provided. The other surface of the mirror chip 11 (the surface to which the adhesive member 10 is not attached) is then attached and held by suction by means of a collet, which is not shown in the drawings, the collet is moved above the die bonding stage, and the collet is lowered toward the semiconductor chip 4 on the mother substrate 3A. As the collet is being lowered, first the adhesive member 10 attached to the mirror chip 11 comes into contact with the heated bonding wires 9, and the temperature of the adhesive member 10 rises and it enters a low-viscosity state. As the collet is lowered further, the parts of the bonding wires 9 located higher than the semiconductor chip 4 enter and become embedded in the low-viscosity adhesive member 10. The lower surface of the adhesive member 10 then comes into contact with the upper surface (second surface 4b) of the semiconductor chip 4, and the adhesive member 10 fills the space between the semiconductor chip 4 and the mirror chip 11. The mirror chip 11 is stacked on the semiconductor chip 4 in this way. The mirror chip 11 and the adhesive member 10 have a larger planar shape than the semiconductor chip 4, and cover the semiconductor chip 4 as seen in a plan view. Portions of the plurality of bonding wires 9 connecting the electrode pads 7 on the semiconductor chip 4 to the connection pads 8 on the wiring substrate 3A, namely at least the parts located higher than the upper surface of the semiconductor chip 4, are embedded in the adhesive member 10. When the mother substrate 3A is moved from the bonding stage, or when the heater of the bonding stage stops heating, the adhesive member 10 cures.

Figure 5A:
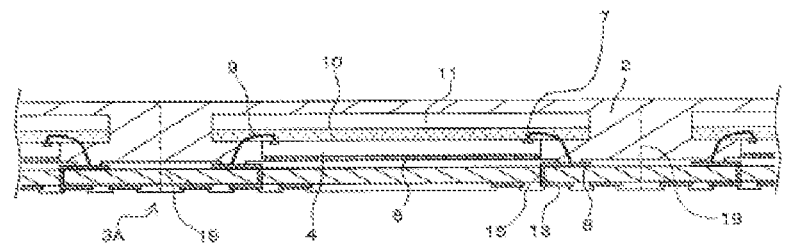
FIG. 5a is a cross-sectional view illustrating the step following FIG. 4d.

A sealing step is then carried out. As illustrated in FIG. 5a, the sealing resin (mold resin) 2 comprising a thermosetting epoxy resin or the like is applied to one surface of the mother substrate 3A (the surface on which the semiconductor chips 4 are installed), in such a way as to cover collectively a plurality of the product-forming regions 18. More specifically, a cavity of a size covering collectively a plurality of the product-forming regions 18 is formed in an upper die, which is a constituent of a molding die of a molding device (which is not shown in the drawings) such as a transfer molding device, and a recessed portion which accommodates the mother substrate 3A is formed in a lower die. When the mother substrate 3A which has completed the wire bonding step is set in the recessed portion of the lower die, and the outer peripheral edge of the mother substrate 3A is clamped between the upper die and the lower die, the cavity of a size covering collectively said plurality of product-forming regions 18 is located above the mother substrate 3A. The cavity is then filled with the sealing resin 2 and is cured at a prescribed temperature (for example 180° C.). In this way the semiconductor chips 4, the bonding wires 9 and the mirror chips 11, for example, are sealed collectively by the sealing resin 2.

Figure 5B:
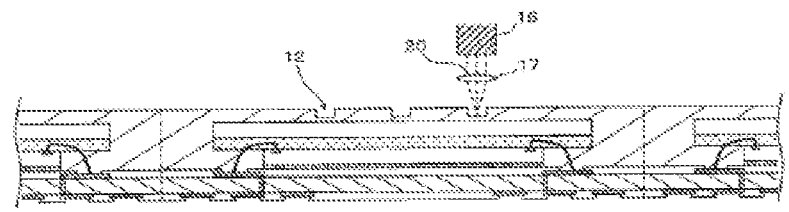

A step of marking the sealing resin 2 is then performed. More specifically, as illustrated in FIG. 5b, a laser 20 such as a YAG laser is radiated from a laser light source 16 via a condensing lens 17 onto the sealing resin 2 formed on the mother substrate 3A, and approximately 5 to 30 µm of the surface of the sealing resin 2 is removed to form the marking 12 in a desired pattern. The pattern comprises letters, images, shapes or the like representing the semiconductor chip 4 inspection results, a company name or a product name, for example. A mask, which is not shown in the drawings, may be used when the laser 20 is radiated, in order to form the marking 12 in the desired pattern.

Figure 5C:
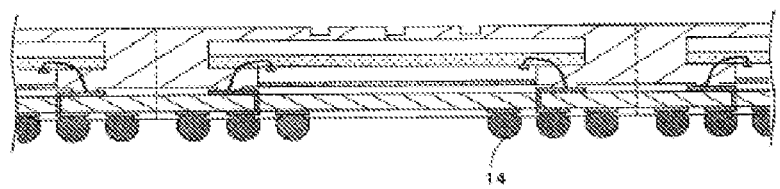
FIG. 5c is a cross-sectional view illustrating the step following FIG. 5b.

A step of mounting balls on the lower surface of the mother substrate 3A (the surface on the opposite side to the surface on which the semiconductor chips 4 are installed) is then carried out. More specifically, as illustrated in FIG. 5c, the electrically conductive solder balls 14 are joined to the plurality of lands 13 disposed in a lattice formation corresponding to each product-forming region 18. Although not shown in the drawings, this ball mounting step may be performed with the mother substrate 3A inverted vertically. As one example, using a ball mounter, which is not shown in the drawings, in which a plurality of suction-attachment holes are formed matching the locations of the lands 13 on the mother substrate 3A, the solder balls 14 are held in the suction-attachment holes and in this condition are joined collectively to the lands 13, with the interposition of flux. The suction attachment of the solder balls 14 is then released, and the solder balls 14 are removed from the ball mounter.

Figure 5D:
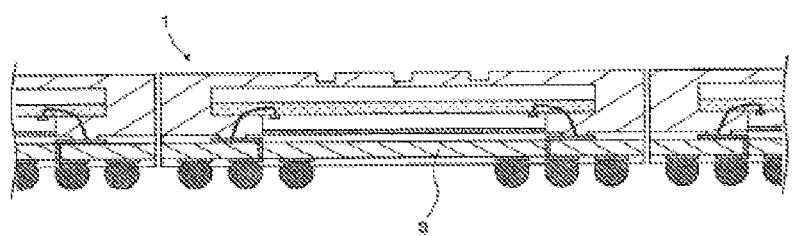
FIG. 5d is a cross-sectional view illustrating the step following FIG. 5c.

A step of dicing the mother substrate 3A is then carried out. More specifically, dicing tape, which is not shown in the drawings, is bonded to the sealing resin 2 on the mother substrate 3A. The mother substrate 3A is then cut lengthwise and crosswise along the dicing lines 19 by means of a dicing blade of a dicing device, to separate the mother substrate 3A into individual product-forming regions 18. The dicing tape is then peeled from the mother substrate 3A to yield a plurality of the semiconductor devices 1, in each of which the semiconductor chip 4 and the mirror chip 11 are installed on the wiring substrate 3, cut from the mother substrate 3A, and are covered by the sealing resin 2, as illustrated in FIG. 5d.

According to this mode of embodiment as described hereinabove, the mirror chip 11, having a planar shape which is larger than that of the semiconductor chip 4, is disposed between the sealing resin 2 and the semiconductor chip 4 installed on the wiring substrate 3, and therefore the semiconductor chip 4 is in a state in which it is covered by the mirror chip 11 as seen in a plan view. Therefore in the marking step, even if the laser 20, such as a high-frequency YAG laser, is radiated onto the surface of the sealing resin 2, the energy of the laser 20 is reflected or blocked by the mirror chip 11, and little of the energy reaches the semiconductor chip 4, thereby reducing the effect on the circuits. In other words, the occurrence of circuit breaks on the semiconductor chip 4 due to the energy of the laser 20 can be suppressed, and the reliability of the semiconductor device 1 can be improved. It is thus not necessary to be concerned about circuit breaks on the semiconductor chip 4, and therefore the marking step can be performed using a high-frequency YAG laser, and finer letters, patterns or the like can therefore be formed in more detail than if a low-frequency laser is used in the marking step, and it is thus possible to improve the visual properties of the marking 12.

Further, the planar shape of the mirror chip 11 is larger than that of the semiconductor chip 4, and therefore not only the semiconductor chip 4, including the electrode pads 7, but also the connection pads 8 on the wiring substrate 3, and the bonding wires 9 which connect the connection pads 8 to the electrode pads 7 on the semiconductor chip 4 are also protected by being covered by the mirror chip 11 as seen in a plan view. Therefore the bonding wires 9, the electrode pads 7 and the connection pads 8 are not exposed when the surface of the sealing resin 2 is removed in the marking step. It is consequently possible to form the marking 12 in any position, and with any size and shape, without being concerned about the positions of the bonding wires 9, the electrode pads 7 or the connection pads 8, and an improvement in the visual properties can therefore be achieved. The mirror chip 11 is a chip without a built-in circuit, on which a circuit is not formed, and therefore no problems arise even if it is subjected to the energy of the laser.

Moreover, the sealing step is performed in a state in which at least portions of the bonding wires 9 are embedded in the adhesive member 10, such as an FOW, and therefore the occurrence of bonding wire 9 flow or shorting between pairs of bonding wires 9 resulting from their becoming entrained when the sealing resin 2 is injected in the sealing process can be suppressed.

If, as in the prior art, injection of the sealing resin 2 were to result in a concomitant bonding wire 9 flow, variability would arise in the distance from the uppermost layer of the semiconductor device 1 to the apex portions of the bonding wires 9. Therefore, in order to reliably prevent the laser 20 damaging the bonding wires 9 when the laser 20 is radiated in order to form the marking 12, the sealing resin 2, which is the uppermost layer of the semiconductor device 1, must be formed to a greater thickness. However, in this mode of embodiment, portions, including at least the apex portions, of the bonding wires 9 are embedded in the adhesive member 10, and therefore variability in the positions of the apex portions of the bonding wires 9 is restricted to within a range comprising the thickness of the adhesive member 10. Therefore the distance from the uppermost layer of the semiconductor device 1 to the apex portions of the bonding wires 9 can be restricted accurately to within a certain range, and as a result the uppermost layer of the semiconductor device 1 does not need to be made thicker than necessary, and this contributes to reducing the thickness of the semiconductor device 1.

Second Mode of Embodiment

Figure 6:
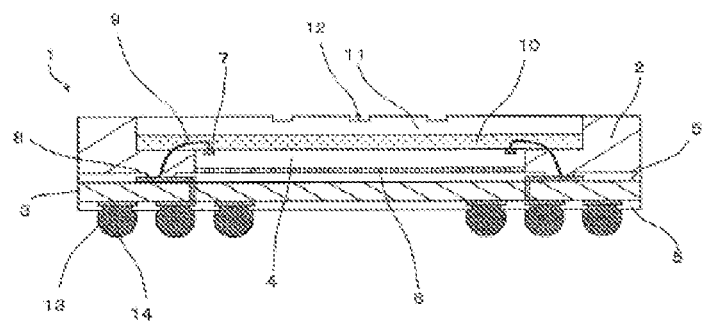
FIG. 6 is a cross-sectional view illustrating a semiconductor device in a second mode of embodiment of the present invention.
Figure 7:
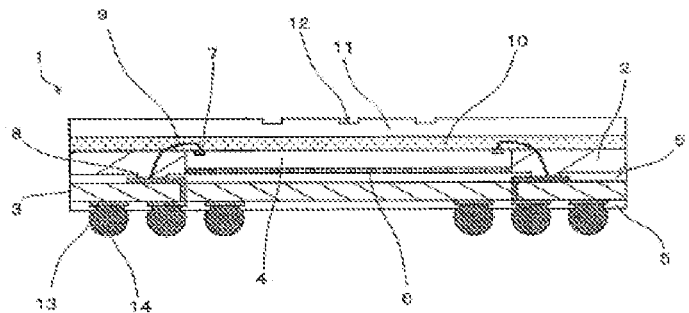
FIG. 7 is a cross-sectional view illustrating a semiconductor device in a third mode of embodiment of the present invention.

A second mode of embodiment of the present invention will now be described with reference to FIG. 6.

In this mode of embodiment the sealing resin 2 is formed without the part thereof that covers the mirror chip 11 as seen in a plan view, and the mirror chip 11 is thus not covered by the sealing resin 2 but is exposed. The marking 12 is then produced by removing the surface of the mirror chip 11 to form a recessed portion, by radiating the laser 20 onto the mirror chip 11 rather than onto the sealing resin 2. Other aspects of the configuration and of the method of manufacture are the same as in the semiconductor device 1 in the first mode of embodiment.

According to this mode of embodiment, the same advantages as in the first mode of embodiment can be obtained, in addition to which the mirror chip 11 is exposed, and therefore the heat dissipation effect of the semiconductor device 1 is improved. Moreover, the semiconductor device 1 can be made thinner because the sealing resin 2 is not present on the mirror chip 11, and, further, the amount of the sealing resin 2 present on the wiring substrate 3 can be reduced compared with the first mode of embodiment, and therefore warping attributable to differences between the thermal expansion coefficients of the wiring substrate 3, the semiconductor chip 4 and the sealing resin 2 can be reduced.

Further, variability in the thickness of the sealing resin 2 is liable to occur when the sealing resin 2 is supplied and cured, and therefore if, for sake of argument, only the sealing resin 2 is present above the semiconductor chip 4, there is a risk that the accuracy of the distance from the uppermost layer of the semiconductor device 1 to the semiconductor chip 4 will deteriorate. Moreover, when the marking 12 is formed by radiating the laser 20 onto the sealing resin 2, it is difficult to control accurately the thickness of the sealing resin 2 that is removed by means of the laser radiation. As a result, in order for the laser 20 to be reliably prevented from reaching the semiconductor chip 4, the sealing resin 2 must be formed to a somewhat greater thickness, and it is consequently difficult to reduce the thickness of the semiconductor device 1.

However, in this mode of embodiment the sealing resin 2 is not present above the semiconductor chip 4, and only the mirror chip 11 and the adhesive member 10 are present. It is easy for the mirror chip 11 to be manufactured in advance with dimensional accuracy, and the dimensional accuracy of the adhesive member 10, comprising an FOW or the like, is also good. Therefore the accuracy of the distance from the uppermost layer of the semiconductor device 1 to the semiconductor chip 4 can be improved. Moreover, compared with a case in which the laser 20 is radiated onto the sealing resin 2, the thickness that is removed when the laser 20 is radiated onto the hard mirror chip 11 can be controlled relatively accurately. The need to provide an unnecessarily thick layer above the semiconductor chip 4 is therefore eliminated, contributing to a reduction in the thickness of the semiconductor device 1.

For example, in a conventional configuration the total thickness of the layer located above the semiconductor chip 4 is (the thickness of the part occupied by the bonding wires 9)+(a tolerance to take into account thickness-direction variability in the locations of the apex portions of the bonding wires 9)+(the thickness of the sealing resin 2 required above the apex portions of the bonding wires 9)+(a tolerance to take into account variability in the thickness of the sealing resin 2). In contrast, in this mode of embodiment the total thickness of the layer located above the semiconductor chip 4 is (the thickness of the part occupied by the bonding wires 9)+(the thickness of the mirror chip 11 and the adhesive member 10)+(a tolerance to take into account variability in the thicknesses of the mirror chip 11 and the adhesive member 10). This is because the thickness-direction variability in the locations of the apex portions of the bonding wires 9 is absorbed within the range comprising the thickness of the adhesive member 10. In this way, according to this mode of embodiment, the semiconductor device 1 can be made thinner than in the prior art.

Third Mode of Embodiment

A third mode of embodiment of the present invention will now be described with reference to FIGS. 7 to 9d.

In this mode of embodiment, in the same way as in the second mode of embodiment, the sealing resin 2 is not formed above the mirror chip 11, and the mirror chip 11 is thus not covered by the sealing resin 2 but is exposed. Then, the mirror chip 11 has essentially the same size and shape as the wiring substrate 3, extending to the peripheral edge portion of the semiconductor device 1 itself. In the same way as in the second mode of embodiment, the marking 12 is produced by removing the surface of the mirror chip 11 to form a recessed portion, by radiating the laser 20 onto the mirror chip 11.

Figure 8A:
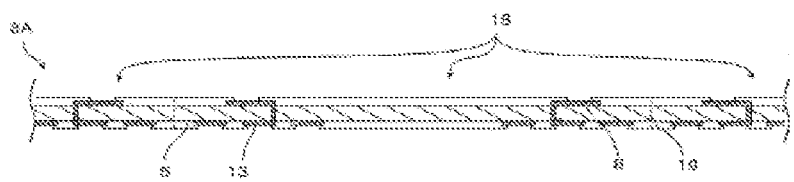
FIG. 8a is a cross-sectional view illustrating one step in a method of manufacturing the semiconductor device illustrated in FIG. 7.
Figure 8B:
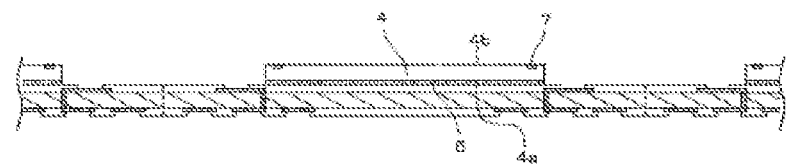
Figure 8C:
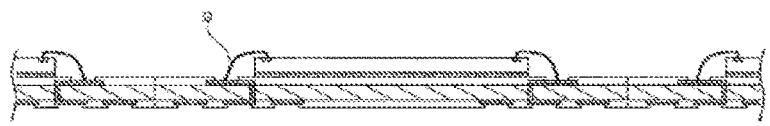
FIG. 8c is a cross-sectional view illustrating the step following FIG. 8b.

In a method of manufacturing the semiconductor chip in this mode of embodiment, in the same way as in the first mode of embodiment the mother substrate 3A is prepared (see FIG. 8a), the semiconductor chips 4 are mounted on the mother substrate 3A with the interposition of the adhesive members 6 (see FIG. 8b), and the electrode pads 7 on the second surfaces (upper surfaces) 4b of the semiconductor chips 4 are connected to the connection pads 8 on the upper surface of the mother substrate 3A by means of the bonding wires 9 (see FIG. 8c).

Figure 8D:
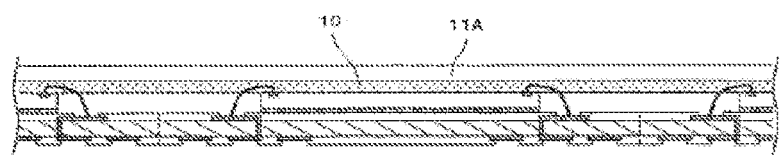
FIG. 8d is a cross-sectional view illustrating the step following FIG. 8c.

Then, as illustrated in FIG. 8d, a wafer 11A, to one surface of which the adhesive member 10 is affixed and which serves as the base material for the mirror chips 11, is secured above the mother substrate 3A and the semiconductor chips 4. More specifically, the adhesive member 10 is secured to the second surfaces (upper surfaces) 4b of the semiconductor chips 4, and portions of the bonding wires 9 are embedded in the adhesive member 10. At this point in time the wafer 11A has not yet been cut.

Figure 9A:
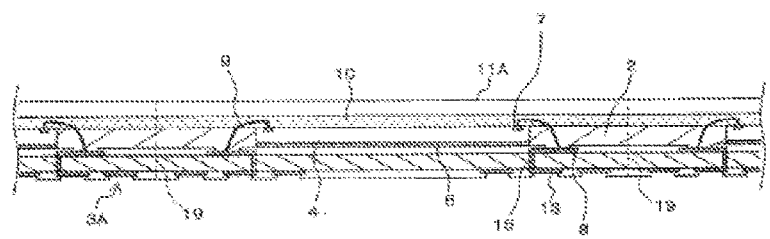
FIG. 9a is a cross-sectional view illustrating the step following FIG. 8d.

Next, as illustrated in FIG. 9a, the spaces to the sides of the semiconductor chips 4, between the upper surface of the mother substrate 3A (the surface on which the semiconductor chips 4 are installed) and the lower surface of the adhesive member 10 (the surface closer to the mother substrate 3A), are filled with the sealing resin 2, which is then cured. At this time, the sealing resin 2 is not supplied above the wafer 11A.

Figure 9B:
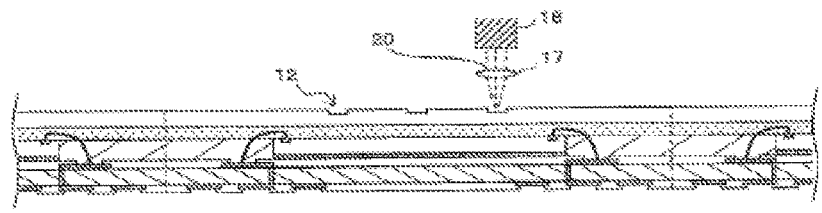
Figure 9C:
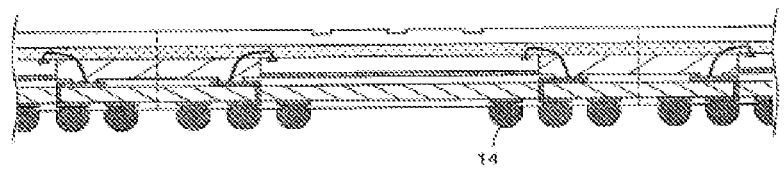
FIG. 9c is a cross-sectional view illustrating the step following FIG. 9b.
Figure 9D:
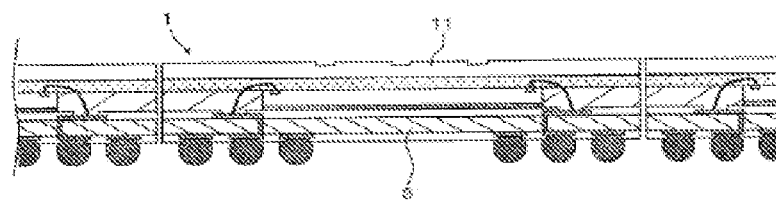
FIG. 9d is a cross-sectional view illustrating the step following FIG. 9c.

As illustrated in FIG. 9b, the markings 12 are formed in a desired pattern by radiating the laser 20, such as a YAG laser, onto the wafer 11A to remove approximately 5 to 30 µm of the surface of the wafer 11A. The solder balls 14 are then joined to the lands 13 on the lower surface of the mother substrate 3A (the surface on the opposite side to the surface on which the semiconductor chips 4 are installed) (see FIG. 9c), and the mother substrate 3A, the sealing resin 2 and the wafer 11A are cut collectively along the dicing lines 19, to separate them into the individual product-forming regions 18 (see FIG. 9d). The mother substrate 3A is cut to form the wiring substrates 3 corresponding to the individual product-forming regions 18, the wafer 11A is cut to form the mirror chips 11, and the sealing resin 2 is cut to a specific size. This completes the semiconductor device 1 illustrated in FIG. 7.

Other aspects of the configuration and of the method of manufacture are the same as in the semiconductor device 1 in the first and second modes of embodiment.

According to this mode of embodiment, the same advantages as in the first and second modes of embodiment can be obtained, in addition to which one of the outer surfaces of the semiconductor device 1 package is formed from only the mirror chip 11, the thickness variability of which can be reduced compared with that of the sealing resin 2, and therefore the external dimensional accuracy of the semiconductor device 1 can be improved.

Fourth Mode of Embodiment

Figure 10:
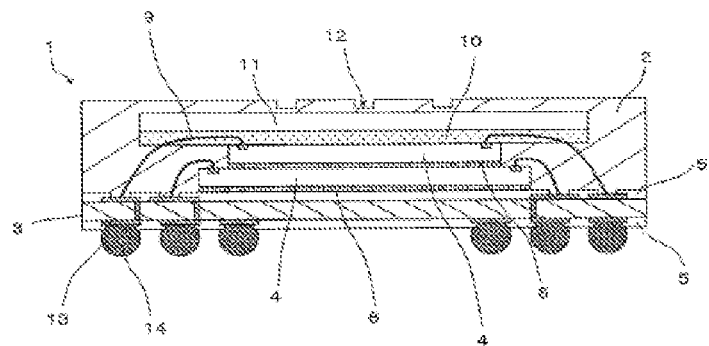
FIG. 10 is a cross-sectional view illustrating a semiconductor device in a fourth mode of embodiment of the present invention.
Figure 11:
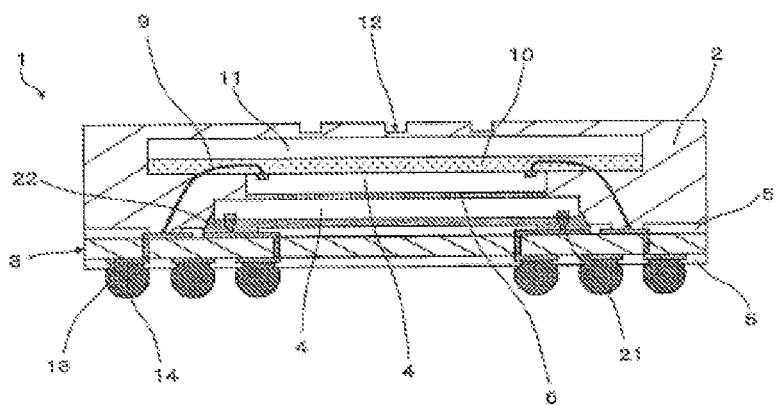
FIG. 11 is a cross-sectional view illustrating a modified example of the semiconductor device illustrated in FIG. 10.

A fourth mode of embodiment of the present invention will now be described with reference to FIGS. 10 and 11.

In the semiconductor device 1 in this mode of embodiment, a plurality (two, in the example illustrated in FIG. 10) of semiconductor chips 4 are stacked on one another on the wiring substrate 3, and the mirror chip 11 is stacked on the second surface (upper surface) 4b of the uppermost of the plurality of semiconductor chips 4, in other words the outermost semiconductor chip 4 located furthest from the wiring substrate 3, and is sealed by means of the sealing resin 2. With the configuration illustrated in FIG. 10, the lower semiconductor chip 4 is secured to the wiring substrate 3 by means of the adhesive member 6, such as a DAF, and the upper semiconductor chip 4 is secured to the lower semiconductor chip 4 by means of the adhesive member 6, such as a DAF. Then the electrode pads 7 on the upper surface of the lower semiconductor chip 4 and the electrode pads 7 on the second surface (upper surface) 4b of the upper semiconductor chip 4 are respectively connected to the connection pads 8 on the upper surface (the one surface) of the wiring substrate 3 by means of the bonding wires 9. Other aspects of the configuration and of the method of manufacture are the same as in the semiconductor device 1 in the first mode of embodiment. It should be noted that using a DAF in combination with an insulating paste as the adhesive member 6 which secures the semiconductor chips 4 makes it possible to reduce cost, and to ensure stable assembly properties.

In this way, the semiconductor device 1 in the present invention may contain two or more stacked semiconductor chips 4. There is no particular restriction to the method of connecting the lowermost semiconductor chip 4 to the wiring substrate 3, or the method of connecting the lower semiconductor chip 4 and the upper semiconductor chip 4. For example, as in the example illustrated in FIG. 11, the configuration may be such that the lowermost semiconductor chip 4 is connected to the connection pads 8 on the upper surface (the one surface) of the wiring substrate 3 by means of a flip-chip connection employing bump electrodes 21 provided on the lower surface (first surface 4a) of the lowermost semiconductor chip 4. In this case, the space between the lower surface of the lowermost semiconductor chip 4 and the upper surface of the wiring substrate 3 is filled by an underfill material 22 which then cured. However, the present invention is particularly effective in configurations in which a circuit is formed at least on the second surface (upper surface) 4b of the uppermost semiconductor chip 4, and the electrode pads 7 forming a portion of said circuit are wire-bonded to the connection pads 8 on the upper surface (the one surface) of the wiring substrate 3 by means of the bonding wires 9.

According to this mode of embodiment, the same advantages as in the first mode of embodiment can be obtained, in addition to which a plurality of semiconductor chips 4 are provided in one semiconductor device 1, and therefore an increase in the level of functionality and an increase in the capacity of the semiconductor device 1 can be achieved. The number of internal semiconductor chips 4 is not limited to 2, and may be three or more.

It should be noted that as a modified example of this mode of embodiment the configuration may be such that, in the same way as in the second and third modes of embodiment, the sealing resin 2 is formed without the part thereof that covers the mirror chip 11 as seen in a plan view, the mirror chip 11 is not covered by the sealing resin 2 but is exposed, and the marking 12 is formed on the upper surface of the mirror chip 11.

The present invention has been described hereinabove on the basis of the first to fourth modes of embodiment, but the present invention is not restricted to these modes of embodiment, and it goes without saying that various modifications are possible without deviating from the gist of the invention.

EXPLANATION OF THE REFERENCE CODES

1 Semiconductor device
2 Sealing resin
3 Wiring substrate
3A Mother substrate
4 Semiconductor chip
4a First surface
4b Second surface
5 Insulating film
5a Opening portion
6 Adhesive member
7 Electrode pad
8 Connection pad
9 Bonding wire (conducting wire)
10 Adhesive member
11 Mirror chip (chip without a built-in circuit)
11A Wafer
12 Marking
13 Land
14 Solder ball
15 Via
16 Laser light source
17 Condensing lens
18 Product-forming region
19 Dicing line
20 Laser
21 Bump electrode
22 Underfill material

What is claimed is:

1. A semiconductor device comprising:
a wiring substrate;
a semiconductor chip which is stacked on one surface of the wiring substrate, has a first surface facing the wiring substrate and a second surface located on the opposite side to the first surface, and on at least the second surface of which a circuit is formed;
a chip without a built-in circuit, on which a circuit is not formed and which is stacked on the second surface of the semiconductor chip; and
a sealing resin disposed at least between the wiring substrate and the chip without a built-in circuit.

2. A semiconductor device comprising:
a wiring substrate;
a semiconductor chip which is stacked on one surface of the wiring substrate, has a first surface facing the wiring substrate and a second surface located on the opposite side to the first surface, and on at least the second surface of which a circuit is formed;
a chip without a built-in circuit, on which a circuit is not formed and which is stacked on the second surface of the semiconductor chip;
a sealing resin disposed at least between the wiring substrate and the chip without a built-in circuit; and
a marking formed at the surface of the chip without a built-in circuit or at the surface of the sealing resin, in a location overlapping the second surface of the semiconductor chip as seen in a plan view.

3. The semiconductor device as claimed in claim 1, wherein a plurality of the semiconductor chips are stacked on the one surface of the wiring substrate, and the chip without a built-in circuit is stacked on the second surface of the outermost semiconductor chip from among the stacked semiconductor chips, located furthest from the wiring substrate.

4. A semiconductor device comprising:
a wiring substrate;
a semiconductor chip which is stacked on one surface of the wiring substrate, has a first surface facing the wiring substrate and a second surface located on the opposite side to the first surface, and on at least the second surface of which a circuit is formed;
a chip without a built-in circuit, on which a circuit is not formed and which is stacked on the second surface of the semiconductor chip;
a sealing resin disposed at least between the wiring substrate and the chip without a built-in circuit; and
a conducting wire which connects an electrode pad provided on the semiconductor chip to a connection pad provided on the wiring substrate.

5. The semiconductor device as claimed in claim 4, wherein the chip without a built-in circuit is secured to the second surface of the semiconductor chip by means of an adhesive member, and a portion of the conducting wire is embedded in the adhesive member.

6. The semiconductor device as claimed in claim 4, wherein a plurality of the semiconductor chips are stacked on the one surface of the wiring substrate, the chip without a built-in circuit is stacked on the second surface of the outermost semiconductor chip from among the stacked semiconductor chips, located furthest from the wiring substrate, and the conducting wire connects at least the electrode pad on the outermost semiconductor chip to the connection pad on the wiring substrate.

7. The semiconductor device as claimed in claim 4, further comprising a marking formed at the surface of the chip without a built-in circuit or at the surface of the sealing resin, in a location overlapping the semiconductor chip as seen in a plan view.

8. The semiconductor device as claimed in claim 2, wherein the sealing resin is provided in such a way as to cover in a planar manner the chip without a built-in circuit, and the marking is formed on a part of the sealing resin that covers the chip without a built-in circuit.

9. The semiconductor device as claimed in claim 2, wherein the sealing resin is provided in a location other than a location overlapping, in a planar manner, the chip without a built-in circuit, and the marking is formed on the chip without a built-in circuit.

10. The semiconductor device as claimed in claim 2, wherein the marking is formed by means of a recessed portion provided in the surface of the chip without a built-in circuit or in the surface of the sealing resin.

11. The semiconductor device as claimed in claim 1, wherein the chip without a built-in circuit covers the semiconductor chip as seen in a plan view.

12. The semiconductor device as claimed in claim 1, wherein the chip without a built-in circuit is a mirror chip having a surface which reflects light.

13. A method of manufacturing a semiconductor device, comprising:
stacking one or a plurality of semiconductor chips on one surface of a wiring substrate;
stacking a chip without a built-in circuit, on which a circuit is not formed, on the semiconductor chip which is stacked on the one surface of the wiring substrate; and
supplying and curing a sealing resin at least between the wiring substrate and the chip without a built-in circuit.

14. The method of manufacturing a semiconductor device as claimed in claim 13, wherein, supplying and curing the sealing resin comprises supplying and curing the sealing resin in a location covering the chip without a built-in circuit, and the method further comprises forming a marking on a part of the sealing resin that covers the chip without a built-in circuit.

15. The method of manufacturing a semiconductor device as claimed in claim 13, wherein, supplying and curing the sealing resin comprises supplying and curing the sealing resin in a location other than a location covering the chip without a built-in circuit, and the method further comprises forming a marking on the chip without a built-in circuit.

16. The method of manufacturing a semiconductor device as claimed in claim 14, wherein, forming the marking comprises radiating a laser at the surface of the chip without a built-in circuit or at the surface of the sealing resin to remove parts of said surface.

17. The method of manufacturing a semiconductor device as claimed in claim 13, further comprising, prior to stacking the chip without a built-in circuit, connecting, by means of a conducting wire, an electrode pad provided on the semiconductor chip to a connection pad provided on the wiring substrate.

* * * * *